United States Patent [19]

Talts

[11] 3,876,303

[45] Apr. 8, 1975

[54] METHOD AND APPARATUS FOR CONTINUOUS, SUCCESSIVE OR STEPWISE EXPOSURE OF A LIGHT-SENSITIVE MATERIAL

[75] Inventor: Gustav Talts, Skarholmem, Sweden

[73] Assignee: Misomex Aktiebolag, Hagersten, Sweden

[22] Filed: May 17, 1973

[21] Appl. No.: 361,057

[30] Foreign Application Priority Data

May 25, 1972 Sweden .............................. 6813/72

[52] U.S. Cl. ....................... 355/67; 355/69; 355/77

[51] Int. Cl. .......................................... G03b 27/78

[58] Field of Search .......................... 355/67, 69, 77

[56] References Cited

UNITED STATES PATENTS 3,588,247 6/1971 Noda .................................. 355/69

3,655,287 4/1972 Brevers ................................ 355/69

3,732,011 5/1973 Hansard ............................... 355/69

*Primary Examiner*—Samuel S. Matthews

*Assistant Examiner*—Russell E. Adams, Jr.

*Attorney, Agent, or Firm*—Larson, Taylor and Hinds

[57] ABSTRACT

A method and apparatus for exposing light sensitive materials. An exposing means is moved relative to a light sensitive material so as to continuously or stepwise cover a selected portion of the surface of the material. The exposure value of the exposing means is changed during successive portions of said relative movement to compensate for secondary curing or fading of the latent exposed image.

16 Claims, 1 Drawing Figure

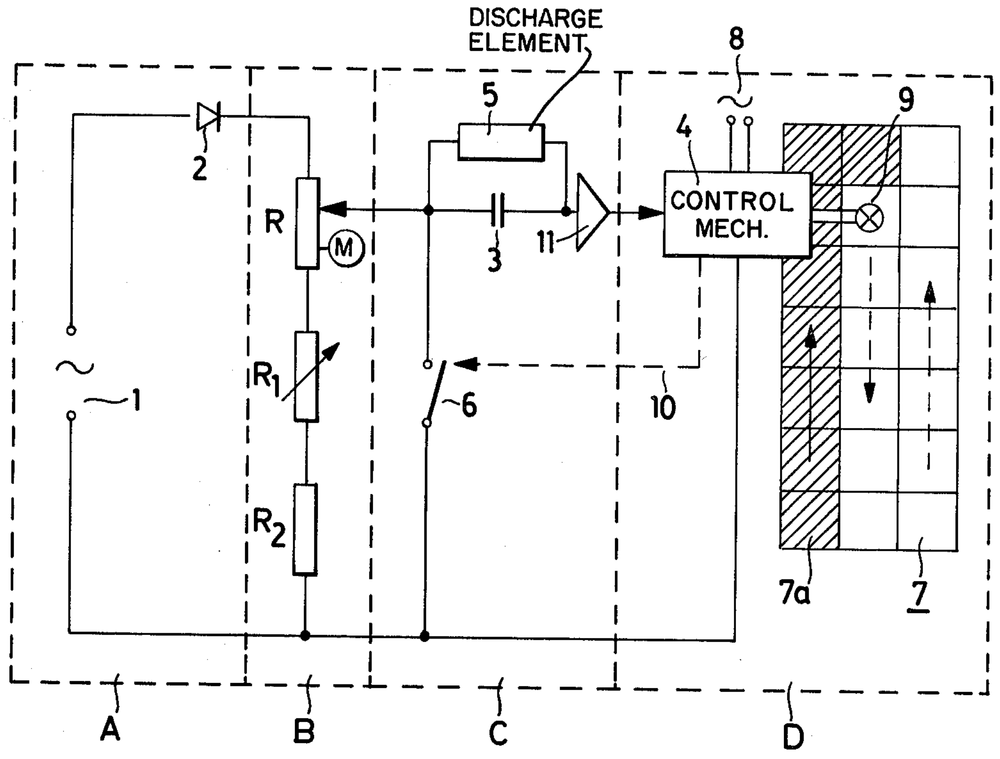
DISCHARGE ELEMENT
5
8
9
4
2
R
M
CONTROL MECH.
3
11
R1
1
6
10
R2
7a
7
A
B
C
D

METHOD AND APPARATUS FOR CONTINUOUS, SUCCESSIVE OR STEPWISE EXPOSURE OF A LIGHT-SENSITIVE MATERIAL

The present invention relates to a method and an apparatus for successive or stepwise exposure of a light sensitive material. By "light sensitive material" in this connection is meant any type of such material which by exposure directly or through an intermediate pattern film or the like obtains a latent image which, after having been developed, comes out visually or in any other form on the exposed material.

The invention is particularly useful in so called multicopying by which is meant that process wherein one and the same light sensitive film or foil is successively or in several successive steps exposed so as to give a large collection film or foil which is not developed until all exposures of the film or foil are made. Multi-copying may be made from one and the same master to give a film having several identical copies or from several different masters to give a collection film or foil which may e.g., be used as a basis for the manufacture of printing forms of the like. The invention is also useful for continuous copying with or without intermediate pattern film such as in cases when a small point of light has to expose a large light sensitive material, whereby the exposure takes place while continuously moving the source of light along the light sensitive material.

The invention is based on a problem which has been observed when multi-copying a film pattern onto large collection films or onto carbon tissues of the type which are utilized when manufacturing e.g., intaglio printing rollers. Therefore, for the sake of simplicity the invention will be described below in connection to such multi-copying, but it is to be understood that the invention is not limited to this field of use, but the invention may be used in any case where a successive, continuous or stepwise exposure shall be made of one and the same light sensitive material before it is developed.

When exposing one and the same light sensitive material layer successively or stepwise some time will pass between the first and the last exposure of the light sensitive material and this has as a consequence that the first exposed part of the material will have to rest a comparatively longer time before being developed than the last exposed part. This difference in time passing between exposure and development may be fairly large when making a great number of exposures on the light sensitive material. The invention is based on the observation that the difference in time between exposure and development of the various exposures of the light sensitive material prejudices the quality of the final product. Depending on what kind of light sensitive material is used there will be some secondary curing or some weakening, so called fading, of the latent image during the time which passes between exposure and development. In such materials where secondary curing takes place the first exposed image will appear as if it was exposed for a longer time than the last exposed picture due to the secondary curing, even if the exposing time and the other exposing conditions are identical. In materials involving fading of the latent image the opposite will occur, viz. that the first exposed image will appear as if it had obtained a shorter exposure value than the last exposed image.

In previous attempts to overcome this problem some time has been allowed to pass before the multi-exposed material was developed, so that all exposed parts of the material would be allowed to undergo secondary curing or fading for some time. By this practice the differences in secondary curing or fading of the latent exposed images may be eliminated to some extent. However, this method involves an intentional but undesirable waste of time, and the said differences may not be completely eliminated.

Accordingly the present invention proposes that the exposure value for the exposed images be changed following the continuous, successive or stepwise exposure to thereby compensate for any secondary curing or fading of the latent exposed image. For such light sensitive materials, where secondary curing takes place there is provided a means for increasing the exposure time or the light intensity following the successive exposures, while for such materials in which the latent exposed picture is fading there is provided means for reducing of the exposure time or or the light intensity following the previously observed fading of the latent image. When proceeding in this manner the multi-exposed light sensitive material may be developed immediately after the last exposure has been made, and a developed image is obtained which shows a uniform exposure and otherwise high quality.

In a particular embodiment of the invention the exposure value is continuously controlled while the exposure is made stepwise. It is essential to the invention that the change of exposure value can be made quicker or slower, depending on the kind of light sensitive material. The secondary curing or the fading of the latent exposed image normally occurs according to an exponential function, and in order to obtain the intended result, the change of exposure value likewise ought to occur according to an exponential function corresponding to the secondary curing or secondary fading. However, a linear change of the exposure values may often give a fully acceptable result.

In the accompanying drawing an embodiment of an apparatus for executing the above described method is shown diagrammatically. The apparatus contains four main parts, viz. a feeder part A, a compensation part B, a timer part C, and an exposure part D.

The feeder part A comprises an source 1 for A C current and a rectifier 2. Between one terminal of the current source 1 and the rectifier 2 the compensation part B is connected, and this comprises basically three resistances, connected in series, viz. a motordriven potentiometer R, a manually adjustable potentiometer $R_1$, and a fixed resistance $R_2$ for adapting the apparatus to different conditions. The motordriven potentiometer R may be brought to rotate in either direction depending on whether a continuous increase or a continuous reduction of the exposure time is wished following the exposures. With the aid of the manually controllable potentiometer $R_1$ the voltage across the motordriven potentiometer R may be controlled, and with an increasing or decreasing voltage across the potentiometer R an increasing or decreasing change of its continuously changed output voltage is obtained.

The output of the motordriven potentiometer R is over a capacitor pack 3 and an amplifier 11 of the timer part connected to a controlling mechanism 4 of the exposure part D, the other terminal of which is connected to the current source 1 and thereby to the fixed resistance $R_2$. A discharge element 5 is connected in parallel over the capacitor pack 3 between the source of the discharge element 5 and the current source 1 there is an exposure switch 6. The controlling mechanism 4 of the exposure part D is motordriven and may be moved in two directions perpendicular to each other along the light sensitive material 7 to be exposed. For this purpose the controlling mechanism 4 is connected to a source 8 of A C current. For establishing the exposure the controlling mechanism 4 contains a lamp 9 and this is connected to the exposure switch 6 as is diagrammatically shown with the dotted line 10.

The operation of the apparatus is the following: The exposure switch 6 is normally open, and when the apparatus is connected to the current source 1 a current begins to flow through the rectifier 2 and the resistances, R, $R_1$, and $R_2$. Thereby the capacitor pack 3 will be charged. At the same time the motor of the potentiometer R begins to rotate, and the controlling mechanism 4 is prepared to expose the first parts 7*a* of the light sensitive material 7. When the capacitor pack 3 is fully charged the switch 6 is closed and a discharge of the capacitor pack 3 through element 5 begins. During the whole time that the capacitor pack 3 is discharging over the discharge element 5 exposure takes place by switching on the lamp 9. Due to the connection 10 between the controlling mechanism 4 and the exposure switch 6 said switch 6 is opened as soon as the discharge has ended, and at the same time as the capacitor is recharged, the controlling mechanism 4 is moved one step as diagrammatically shown with the arrows in the light sensitive material 7. The voltage by means of which the capacitor pack 3 is charged, is continuously changed by means of the motordriven potentiometer R, and each exposure of the various parts of the light sensitive material 7 is made with an exposure time which is reduced or increased compared with the preceeding exposure.

As already mentioned the change of exposure time between the different exposures of the light sensitive materials 7 is controlled by means of the manually controllable potentiometer $R_1$, and in case it is desired to change the exposure time according to an exponential function the compensator part B may be formed with means known per se for providing such exponential change of the exposure time.

When the complete light sensitive material is exposed, it can be immediately developed, and provided the potentiometer $R_1$ is correctly adjusted, a collection image is obtained which has a completely uniform density of the developed images and in which consequently a complete compensation has been made of the secondary curing or the secondary fading which has taken place in the previously exposed parts of the light sensitive material.

It is to be understood that the above described apparatus is only one illustrative example and that numerous modifications may occur within the scope of the invention. Thus the change the exposure value may occur by changing the light intensity instead of changing the exposure time, and in such case the timer part is formed as a time regulator which at given intervals and during exactly equal periods of time connects the motordriven potentiometer R with the controlling mechanism. In cases when continuous exposing takes place the said time regulator may be eliminated and the controlling mechanism directly connected to the motordriven potentiometer which thereby transmits the continuously changing voltage to the exposure lamp 9. In another embodiment of the invention the potentiometer R is driven by a motor having an electronic speed control, so that the output voltage may be controlled according to any function.

What we claim is:

1. A method of exposing light sensitive material comprising the steps of:

moving an exposure means relative to the light sensitive material so as to cover a selected portion of the surface of the material, and changing the exposure value of the exposure means during successive portions of said relative movement to compensate for secondary curing or fading of the latent exposed image.

2. The method according to claim 1, said changing step including extending the exposure time during successive portions.

3. The method of claim 1, wherein said changing step includes increasing the light intensity during successive portions.

4. The method according to claim 1, wherein the changing step includes reducing the exposure time during successive portions.

5. The method according to claim 1, wherein said changing step includes decreasing the light intensity during successive portions.

6. The method according to claim 1, including changing the exposure value continuously while operating the exposure means stepwise.

7. The method according to claim 1, wherein the speed with which the exposure value is changed is dependent on the nature of the light sensitive material.

8. The method according to claim 1, including changing the exposure value linearly.

9. The method according to claim 1, including changing the exposure value exponentially.

10. An apparatus for exposing a light sensitive material, comprising:

exposure means for exposing the light sensitive material, means for establishing relative movement between the exposure means and the light sensitive means so that the exposure means covers a selected portion of the light sensitive material, and means for changing the exposure value of the exposure means during successive portions of the said relative movement to compensate for secondary curing or fading of the latent exposed image.

11. An apparatus according to claim 10, further comprising a supplying means for feeding electrical current, a compensation means operatively connected to receive current from the feeder means for initiating a change of exposure value during different of said portions of relative movement, and release means operatively connected to the compensation means and the exposure means for effecting the exposure during each of said portions of the relative movement, said exposure means including means for receiving a signal from the release means during each of said portions and for transmitting the exposure onto the light sensitive material during each of said portions.

12. An apparatus according to claim 11, said compensation means including a motor driven potentiometer for changing the voltage associated with each exposure in accordance with either a linear or an exponentional function.

13. An apparatus according to claim 12, said compensation means further containing a manually controllable potentiometer connected in series with the motor driven potentiometer for controlling the motor driven potentiometer to change the voltage to change the speed with which the exposure is obtained.

14. An apparatus according to claim 11, said release means comprising means for providing the exposure means with a voltage of a duration or intensity corresponding to the condition of the compensation means.

15. Apparatus according to claim 14, said release means comprising a capacitor pack having a discharge element connected in parallel therewith, an amplifier and an exposure switch for transmitting a voltage of a particular duration to the exposure means, said amplifier being positioned to receive a voltage for operating said exposure switch.

16. An apparatus according to claim 15, said exposure means comprising a controlling mechanism having means for providing a continuous, successive or stepwise exposure of a light sensitive material.

* * * * *